(12) United States Patent
Larsson

(10) Patent No.: US 12,111,356 B2
(45) Date of Patent: Oct. 8, 2024

(54) SYSTEM AND METHOD FOR ACCESS CONTROL OF A PLURALITY OF INSTRUMENTS EMBEDDED IN A SEMICONDUCTOR DEVICE

(71) Applicant: Erik Larsson, Halmstad (SE)

(72) Inventor: Erik Larsson, Halmstad (SE)

( * ) Notice: Subject to any disclaimer, the term of this patent is extended or adjusted under 35 U.S.C. 154(b) by 0 days.

(21) Appl. No.: 17/766,849

(22) PCT Filed: Oct. 9, 2020

(86) PCT No.: PCT/EP2020/078417
§ 371 (c)(1),
(2) Date: Apr. 6, 2022

(87) PCT Pub. No.: WO2021/069666
PCT Pub. Date: Apr. 15, 2021

(65) Prior Publication Data
US 2024/0061041 A1    Feb. 22, 2024

(30) Foreign Application Priority Data

Oct. 11, 2019 (SE) .................................. 1930325-4

(51) Int. Cl.
*G01R 31/3185* (2006.01)
*G01R 31/317* (2006.01)
*G01R 31/3183* (2006.01)

(52) U.S. Cl.
CPC .............. *G01R 31/318555* (2013.01); *G01R 31/31723* (2013.01); *G01R 31/31724* (2013.01);

(Continued)

(58) Field of Classification Search
CPC ...... G01R 31/318555; G01R 31/31723; G01R 31/318558; G01R 31/318314; G01R 31/31724
See application file for complete search history.

(56) References Cited

U.S. PATENT DOCUMENTS 10,996,271 B1 *   5/2021  Weinraub ........... G01R 31/2851
11,200,128 B2 *  12/2021  Deb ....................... G06F 11/263
(Continued)

OTHER PUBLICATIONS

A. M. Y. Ibrahim and H. G. Kerkhoff, "An On-Chip IEEE 1687 Network Controller for Reliability and Functional Safety Management of System-on-Chips," 2019 IEEE International Test Conference in Asia (ITC-Asia), Tokyo, Japan, 2019, pp. 109-114 (Year: 2019).*

(Continued)

*Primary Examiner* — Cynthia Britt
(74) *Attorney, Agent, or Firm* — DINSMORE & SHOHL LLP

(57) ABSTRACT

A system for accessing a plurality of instruments embedded in a semiconductor device includes a hardware interface and a test controller for testing the semiconductor device or generating test patterns for the semiconductor device, wherein the test controller comprises an instrument connectivity language and a procedural description language configuration for operating the instruments. The test controller is configured to perform the steps of: testing at least one functionality of each of the plurality of instruments, thereby receiving a fault status of each of the plurality of instruments; and based on the fault status of the plurality of instruments, configuring a test block in the semiconductor device such that valid test patterns for the semiconductor (Continued)

device can be generated without updating the instrument connectivity language and procedural description language configuration.

12 Claims, 14 Drawing Sheets

(52) U.S. Cl.
CPC ........... *G01R 31/318558* (2013.01); *G01R 31/318314* (2013.01)

(56) References Cited

U.S. PATENT DOCUMENTS

| | | | |
|---|---|---|---|
| 2002/0121913 A1* | 9/2002 | Miller | G01R 31/2874 324/750.08 |
| 2010/0138706 A1 | 6/2010 | Warren | |
| 2012/0137186 A1 | 5/2012 | Portolan et al. | |
| 2013/0159799 A1 | 6/2013 | Brown et al. | |
| 2014/0298125 A1 | 10/2014 | Devadze et al. | |
| 2015/0349969 A1* | 12/2015 | Dworak | G06F 21/80 380/28 |
| 2018/0335475 A1* | 11/2018 | Danialy | G01R 31/31855 |
| 2020/0073774 A1* | 3/2020 | Deb | G06F 11/2733 |
| 2020/0341057 A1* | 10/2020 | Cheng | G01R 31/31724 |
| 2022/0108760 A1* | 4/2022 | Sinha | G11C 29/14 |

OTHER PUBLICATIONS

A. L. Crouch, B. G. Van Treuren and J. Rearick, "P1687.1: Accessing Embedded 1687 Instruments using Alternate Device Interfaces other than JTAG," 2019 IEEE AUTOTESTCON, National Harbor, MD, USA, 2019, pp. 1-7 (Year: 2019).*

T. Payakapan et al., "A case study: Leverage IEEE 1687 based method to automate modeling, verification, and test access for embedded instruments in a server processor," 2015 IEEE International Test Conference (ITC), Anaheim, CA, USA, 2015, pp. 1-10, (Year: 2015).*

F. G. Zadegan, D. Nikolov and E. Larsson, "A self-reconfiguring IEEE 1687 network for fault monitoring," 2016 21th IEEE European Test Symposium (ETS), Amsterdam, Netherlands, 2016, pp. 1-6, (Year: 2016).*

Embedded Instrumentation: Its Importance and Adoption in the Test and Measurement Marketplace, Frost and Sullivan, Whitepaper, 2010, 20 p.

IEEE standard for access and control of instrumentation embedded within a semiconductor device,? IEEE Std 1687-2014, 2014.

IEEE standard for access and control of instrumentation embedded within a semiconductor device,? IEEE Std. 1149.1, 2013.

Larsson, E., Xiang, Z., & Murali, P. (2020). IEEE Std. P1687.1 for Access Control of Reconfigurable Scan Networks. In 2020 IEEE European Test Symposium (ETS) Institute of Electrical and Electronics Engineers Inc.

Larsson, Erik, et al., IEEE Std. P1687.1: translator and protocol, International Test Conference (ITC), 2019.

* cited by examiner

| Byte/Bit | b7 | b6 | b5 | b4 | b3 | b2 | b1 | b0 |
|---|---|---|---|---|---|---|---|---|
| 11 | 0 | 0 | 0 | 0 | 0 | 0 | 0 | 0 |
| 10 | 0 | 1 | 1 | 1 | 1 | 1 | 1 | 1 |

| 0 | 1 | 1 | 1 | 1 | 1 | 1 | 1 |
|---|---|---|---|---|---|---|---|

FIG. 8A

| Byte/Bit | b7 | b6 | b5 | b4 | b3 | b2 | b1 | b0 |
|---|---|---|---|---|---|---|---|---|
| 11 | 0 | 0 | 0 | 0 | 0 | 0 | 0 | 0 |
| 10 | 0 | 1 | 1 | 1 | 1 | 1 | 1 | 0 |

| 0 | 1 | 1 | 1 | 1 | 1 | 1 | 0 |
|---|---|---|---|---|---|---|---|

FIG. 8B

| Byte/Bit | b7 | b6 | b5 | b4 | b3 | b2 | b1 | b0 |
|---|---|---|---|---|---|---|---|---|
| 15 | 1 | 0 | 1 | 0 | 1 | 0 | 1 | 0 |
| 14 | 0 | 0 | 0 | 0 | 0 | 0 | 0 | 1 |
| 13 | 1 | 0 | 0 | 0 | 0 | 0 | 0 | 0 |
| 12 | 0 | 0 | 1 | 0 | 0 | 0 | 1 | 0 |
| 11 | 0 | 1 | 0 | 0 | 0 | 0 | 0 | 0 |
| 10 | 1 | 0 | 1 | 0 | 1 | 0 | 1 | 0 |
| 9  | 0 | 0 | 0 | 0 | 0 | 0 | 0 | 1 |
| 8  | 1 | 0 | 0 | 0 | 0 | 0 | 0 | 0 |
| 7  | 0 | 0 | 0 | 0 | 0 | 0 | 0 | 1 |
| 6  | 0 | 1 | 0 | 0 | 0 | 0 | 0 | 0 |
| 5  | 1 | 0 | 1 | 0 | 1 | 0 | 1 | 0 |
| 4  | 0 | 0 | 0 | 0 | 0 | 0 | 0 | 1 |
| 3  | 1 | 0 | 0 | 0 | 0 | 0 | 0 | 0 |
| 2  | 0 | 0 | 0 | 0 | 0 | 0 | 0 | 0 |
| 1  | 0 | 1 | 0 | 0 | 0 | 0 | 0 | 0 |

Test data bits for scan register 3 — byte 15
iApply — bytes 14, 13
iWrite3 — bytes 12, 11
Test data bits for scan register 2 — byte 10
iApply — bytes 9, 8
iWrite2 — bytes 7, 6
Test data bits for scan register 1 — byte 5
iApply — bytes 4, 3
iWrite1 — bytes 2, 1

 The bits which specify the iWrite command

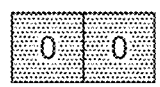 The bits which specify the address of scan registers

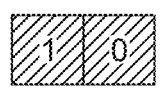 The bits which specify the iApply command

 The bits which indicate the number of test data bytes

Test data x'aa'

FIG. 13

| | Byte/Bit | b7 | b6 | b5 | b4 | b3 | b2 | b1 | b0 |
|---|---|---|---|---|---|---|---|---|---|
| Dummy bits for scan register 3 | 15 | 0 | 0 | 0 | 0 | 0 | 0 | 0 | 0 |
| iApply { | 14 | 0 | 0 | 0 | 0 | 0 | 0 | 0 | 1 |
| | 13 | 1 | 0 | 0 | 0 | 0 | 0 | 0 | 0 |
| iRead3 { | 12 | 0 | 0 | 0 | 0 | 0 | 0 | 1 | 0 |
| | 11 | 0 | 0 | 0 | 0 | 0 | 0 | 0 | 0 |
| Dummy bits for scan register 2 | 10 | 0 | 0 | 1 | 0 | 1 | 0 | 1 | 0 |
| iApply { | 9 | 0 | 0 | 0 | 0 | 0 | 0 | 0 | 1 |
| | 8 | 1 | 0 | 0 | 0 | 0 | 0 | 0 | 0 |
| iRead2 { | 7 | 0 | 0 | 0 | 0 | 0 | 0 | 0 | 1 |
| | 6 | 0 | 0 | 0 | 0 | 0 | 0 | 0 | 0 |
| Dummy bits for scan register 1 | 5 | 0 | 0 | 0 | 0 | 0 | 0 | 0 | 0 |
| iApply { | 4 | 0 | 0 | 0 | 0 | 0 | 0 | 0 | 1 |
| | 3 | 1 | 0 | 0 | 0 | 0 | 0 | 0 | 0 |
| iRead1 { | 2 | 0 | 0 | 0 | 0 | 0 | 0 | 0 | 0 |
| | 1 | 0 | 0 | 0 | 0 | 0 | 0 | 0 | 0 |
 The bits which specify the iRead command
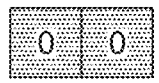 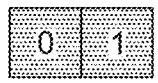 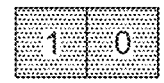 The bits which specify the address of scan registers
 The bits which specifies the iApply command
 The bits which indicate the number of dummy bytes
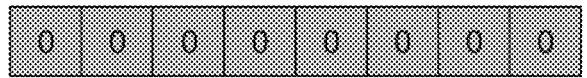
Dummy bits
FIG. 14

SYSTEM AND METHOD FOR ACCESS CONTROL OF A PLURALITY OF INSTRUMENTS EMBEDDED IN A SEMICONDUCTOR DEVICE

CROSS-REFERENCE TO RELATED APPLICATIONS

This application is the U.S. National Stage of PCT/EP2020/078417 filed on Oct. 9, 2020, which claims priority to Sweden Patent Application 1930325-4 filed on Oct. 11, 2019, the entire content of both are incorporated herein by reference in their entirety.

FIELD OF THE INVENTION

The present disclosure relates to a system and a corresponding method for accessing a plurality of instruments embedded in a semiconductor device. The system and method make use of an on-chip test block and computer-implemented method for identifying and repairing effects of faults in the semiconductor device with respect to testing, tuning and configuration of the semiconductor device.

BACKGROUND OF THE INVENTION

The development of semiconductor technology enables integrated circuits (ICs) with smaller, faster and more transistors. The development gives advantages, such as the possibility to implement more functionality to ever-increasing performance. There are, however, growing challenges to avoid malfunctioning. Smaller and faster transistors lead to tighter margins, both in device sizes and timing, which, in combination with higher transistor count, increase the need of testing, tuning, configuration, and so on.

Embedded (on-chip) features, often referred to as instruments, are increasingly used at different stages through the life cycle of ICs: from prototype debug, test and validation to in-field monitoring and test. The number of instruments in modern ICs increases and can be in order of thousands.

IEEE Std. 1687 and IEEE Std. 1149.1 were developed to offer flexible and scalable access to embedded instruments. The flexibility to access arbitrary instruments is achieved by dynamically configuring the active scan-path so that only desired instruments are included, for example by means of segment insertion bits (SIBs). The standards include two description languages, instrument connectivity language (ICL) and procedural description language (PDL). ICL describes how instruments are interconnected. PDL describes how to operate on instruments. The access to reconfigurable scan networks is typically performed via the test access port of IEEE Std. 1149.1.

While embedded instruments are needed to test, tune, and configure ICs throughout its lifetime, the flexibility in accessing these instruments is limited. For example, if a physical implementation of an IEEE Std. 1687 network changes due to faults, the ICL and PDL need to be updated for the faulty IC. There is thus a need for an improved and efficient solution for access control of instruments of ICs.

SUMMARY OF THE INVENTION

The present disclosure relates to a system for testing a semiconductor device, localization of faults and work around faults by excluding them from tests. According to a first aspect the present disclosure relates to a system for accessing a plurality of instruments embedded in a semiconductor device, the system comprising:
  a hardware interface, such as a test access port or a functional port, configured to access a control mechanism for controlling the plurality of instruments;
  a test controller for testing the semiconductor device or generating test patterns for the semiconductor device, wherein the test controller comprises an instrument connectivity language and a procedural description language configuration for operating the instruments, the test controller being configured to perform the steps of:
    a. testing at least one functionality of each of the plurality of instruments by accessing the control mechanism for controlling the plurality of instruments through the hardware interface, thereby receiving a fault status of each of the plurality of instruments; and
    b. based on the fault status of the plurality of instruments, configuring a test block in the semiconductor device such that valid test patterns for the semiconductor device can be generated without updating the instrument connectivity language and procedural description language configuration.

Preferably the test controller is located outside the semiconductor device, whereas the test block is a hardware component placed between the semiconductor device boundary and the instruments, which may be reconfigurable scan networks.

The present disclosure describes systems and methods for test and repair of faulty elements of the semiconductor device and repair of the same. The term 'repair' does not imply an actual physical repair of the semiconductor device but repairing the functionality of the instrument in order to perform the test. A further advantage of the presently disclosed system is that, in the case where one or more instruments are broken or non-functional in any way, the remaining instruments in the semiconductor device can still be used.

Instruments may be accessed by a SIB control register (SCR), operation commands for each instrument, an instrument control register (ICR), and the length of instruments—Instrument length memory (ILM). One advantage of the presently proposed access control is the possibility to:
  ensure that instruments are only accessed in allowed combinations, and eventual attempts to access instruments in not allowed combinations can be detected;
  ensure that only allowed commands are used to operate on instruments, and eventual attempts to operate on instruments in other ways can be detected;
  ensure that data to and from instruments follows the length restriction in ILM.

The present disclosure further relates to a method for testing a semiconductor device, the method comprising:
  configuring a test by defining interconnections of a plurality of instruments in the semiconductor device using an instrument connectivity language and defining operations of the instruments using a procedural description language;
  accessing a control mechanism for controlling the plurality of instruments through a hardware interface to test at least one functionality of each of a plurality of instruments, thereby receiving a fault status of each of the plurality of instruments;
  configuring a test block in the semiconductor device to exclude faulty hardware parts for specific instruments based on the fault status of the plurality of instruments, or excluding a procedural description language command specifically related to the faulty hardware parts; and performing a full test using all the plurality of instruments in the semiconductor device without updating the defined interconnections and operations of the instruments in the test, and to a method for accessing a plurality of instruments embedded in a semiconductor device, the method comprising the steps of:

providing a hardware interface, such as a test access port or a functional port, configured to access a control mechanism for controlling of the plurality of instruments;

providing a test controller for testing the semiconductor device or generating test patterns for the semiconductor device, wherein the test controller comprises an instrument connectivity language and a procedural description language configuration for operating the instruments;

testing at least one functionality of each of the plurality of instruments by accessing the a control mechanism for controlling the plurality of instruments through the hardware interface, thereby receiving a fault status of each of the plurality of instruments; and based on the fault status of the plurality of instruments, configuring a test block in the semiconductor device such that valid test patterns for the semiconductor device can be generated without updating the instrument connectivity language and procedural description language configuration.

As would be understood by a person skilled in the art, the system for testing a semiconductor device may be configured to perform any step of the method for testing a semiconductor device or method for accessing a plurality of instruments embedded in a semiconductor device and vice versa.

BRIEF DESCRIPTION OF THE DRAWINGS

The invention will in the following be described with reference to the accompanying drawings, which are exemplary and not limiting to the presently disclosed system and method for accessing a plurality of instruments embedded in a semiconductor device;

FIG. 8 shows examples of bit sequences for test and repair commands;

FIG. 13 shows an example of a bit sequence of an ALLWrite process;

FIG. 14 shows an example of a bit sequence of an ALLRead process;

DETAILED DESCRIPTION OF THE INVENTION

Figure 1:
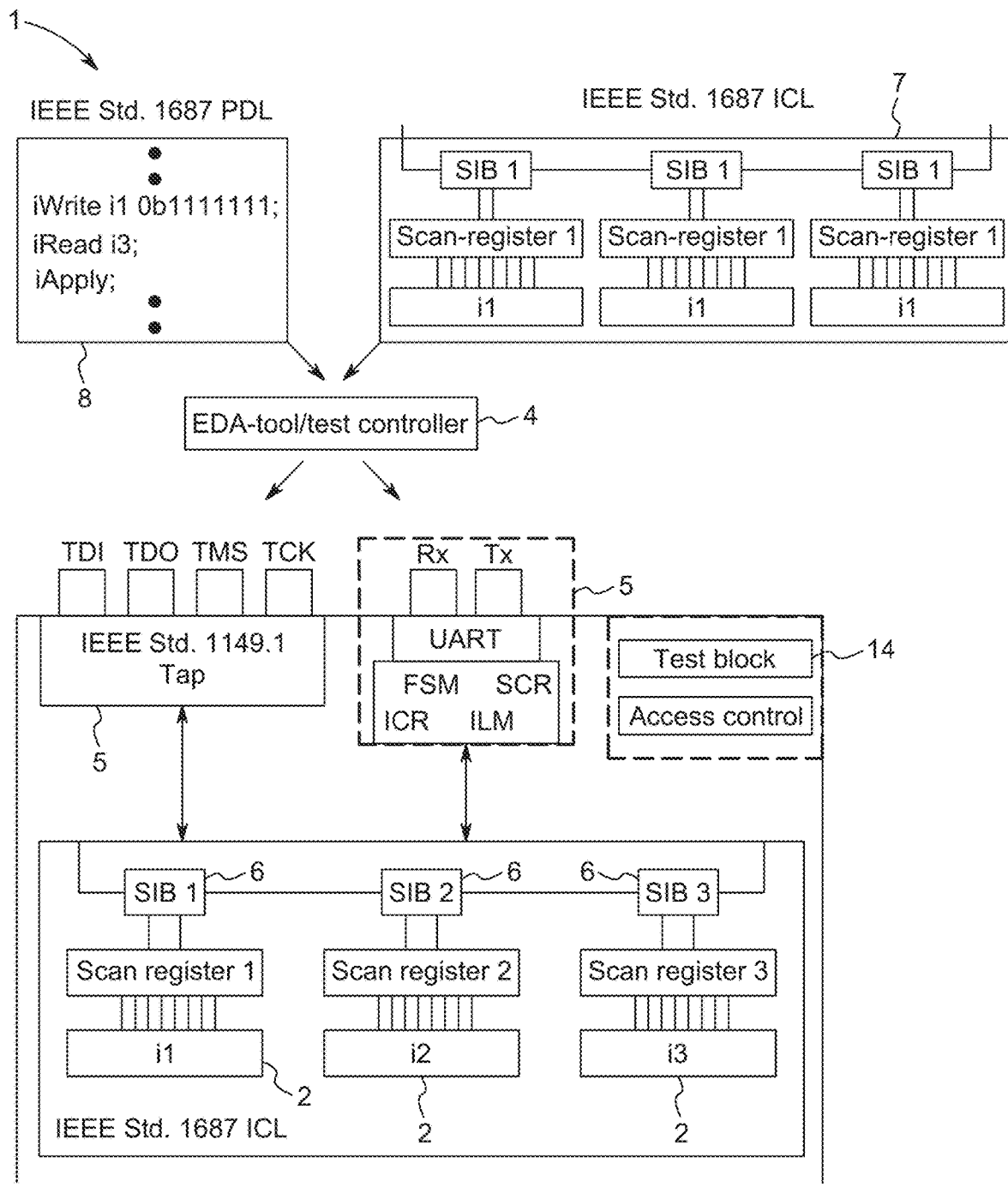
FIG. 1 shows an embodiment of the presently disclosed system for accessing a plurality of instruments embedded in a semiconductor device.

The present disclosure relates to a system for accessing a plurality of instruments embedded in a semiconductor device. Preferably the system comprises a hardware interface, such as a test access port or a functional port, configured to access a control mechanism, such as segment insertion bits, for controlling the plurality of instruments and a test controller for testing the semiconductor device or generating test patterns for the semiconductor device. The hardware interface may be a dedicated test port, such as IEEE Std. 11491 (JTAG), or a functional port, such as UART, SPI, I2C etc. The test controller may comprise an instrument connectivity language and a procedural description language configuration for operating the instruments. The IEEE Std.1687 standard introduces two description languages, Instrument Connectivity Language (ICL) and Procedural Description Language (PDL). The purpose of PDL is to describe the operations of the instruments. The ICL is used to describe the characteristics of the instruments such as data length and position within the network and the requirements for interfacing them.

In a first embodiment the test controller is configured to test at least one functionality of each of the plurality of instruments by accessing the segment insertion bits of the plurality of instruments through the hardware interface, thereby receiving a fault status of each of the plurality of instruments. The step of testing at least one functionality of each of the plurality of instruments may comprise generating and shifting a test sequence through scan chains of all instruments. In one embodiment of the presently disclosed system for accessing a plurality of instruments embedded in a semiconductor device, the system is configured to automatically exclude faulty scan chains from the scan testing. Moreover, an active scan-path may be configured such that only instruments without faulty scan chains are included in the testing. The test controller may be further configured to, based on the fault status of the plurality of instruments, configuring a test block in the semiconductor device such that valid test patterns for the semiconductor device can be generated without updating the instrument connectivity language and procedural description language configuration.

In the electronics industry, embedded instrumentation refers to the integration of test and measurement instrumentation into semiconductor chips (or integrated circuit devices). Instrumentation embedded into chips (embedded instrumentation) is employed in a variety of electronic test applications, including validating and testing chips themselves, validating, testing and debugging the circuit boards where these chips are deployed, and troubleshooting systems once they have been installed in the field. Instruments include, but are not limited to bit error rate test (BERT) engines, BIST for logic devices, margining engines, memory BIST, memory test, random pattern generators, scan chains etc. Specifically, the instruments may be reconfigurable scan networks and the testing may be scan testing.

IEEE Std.1687 enables reconfigurable scan networks which allow only desirable instruments to be included in the active scan-path. Reconfigurable scan networks can become faulty, which may lead to the situation there will be no possibility left to test, trim and configure the IC. In the present disclosure, test and repair of the faulty scan registers is described. Two solutions, based on the hardware and software, to test the reconfigurable scan network, to identify faulty scan registers, and repair the network by excluding the faulty scan register from the network, are provided. In one embodiment the test block in the semiconductor device is configured to exclude faulty hardware parts for specific instruments based on the fault status. According to one embodiment of the presently disclosed system for accessing a plurality of instruments embedded in a semiconductor device, the test block in the semiconductor device is configured to replace a faulty hardware part for a specific instrument with a corresponding repair part.

FIG. 1 shows an embodiment of the presently disclosed system (1) for accessing a plurality of instruments (2) embedded in a semiconductor device (3). The system (1) comprises a test controller (4) for testing the semiconductor device (3) or generating test patterns for the semiconductor device and a test block (14) embedded in the semiconductor device (3). The system (1) further comprises a hardware interface (5) for accessing segment insertion bits (6). The hardware interface may be, for example, a dedicated test port, such as IEEE Std. 11491 (JTAG), or a functional port, such as UART, SPI or I2C. The test controller (4) comprises an instrument connectivity language (7) and a procedural description (8) language configuration for operating the instruments (2). PDL and ICL may be given as inputs to an Electronic Design Automation (EDA) tool or an embedded controller. The test controller may output test patterns.

Figure 2:
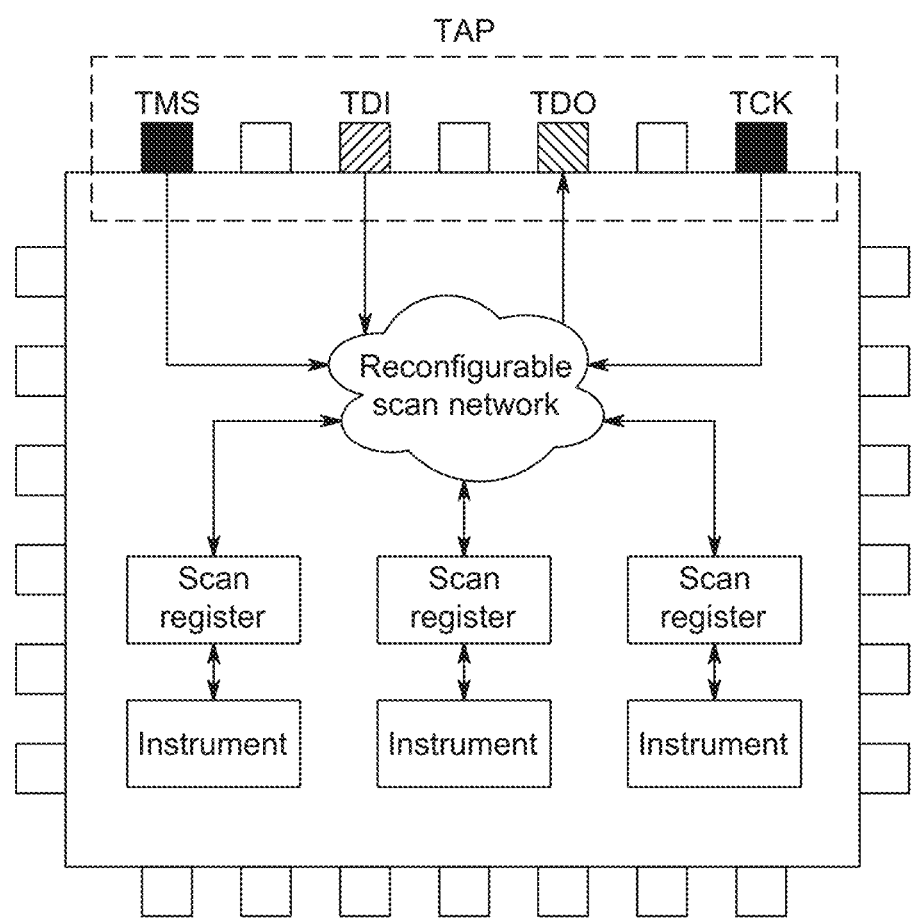
FIG. 2 shows an example of a semiconductor device comprising a test access port and a reconfigurable scan network based on IEEE Std. 1687.
Figure 3:
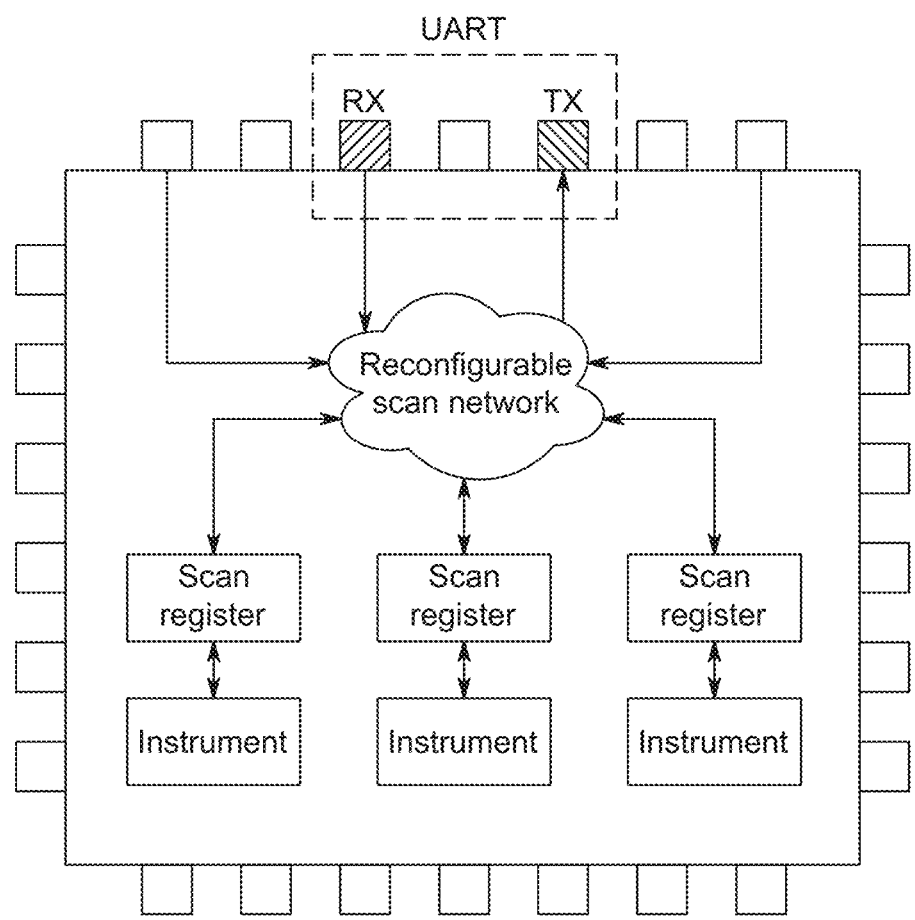
FIG. 3 shows an example of a semiconductor device comprising a universal asynchronous receiver-transmitter (UART) and a reconfigurable scan network based on IEEE Std. 1687.

FIG. 2 shows an example of a semiconductor device comprising a test access port and a reconfigurable scan network based on IEEE Std. 1687. The embedded instruments are coupled with the scan registers and connected as a reconfigurable scan network based on IEEE Std.1687. The Test Access Port (TAP) of IEEE Std.1149.1 is used to connect the reconfigurable scan network and the outside world. Instead of using dedicated test port, IEEE Std. P1687.1 introduces a way to access the scan network with the functional ports. As an example, UART may be used as the functional port, which is shown in FIG. 3

UART

UART is a computer hardware device for asynchronous serial contact, it includes a transmitter and a receiver. The transmitter is essentially a special shift register that loads data in parallel and then shifts it out bit by bit at a specific rate. The receiver, on the other hand, shifts in data bit by bit and then reassembles the data.

IEEE Std. 1687 (IJTAG)

Figure 4:
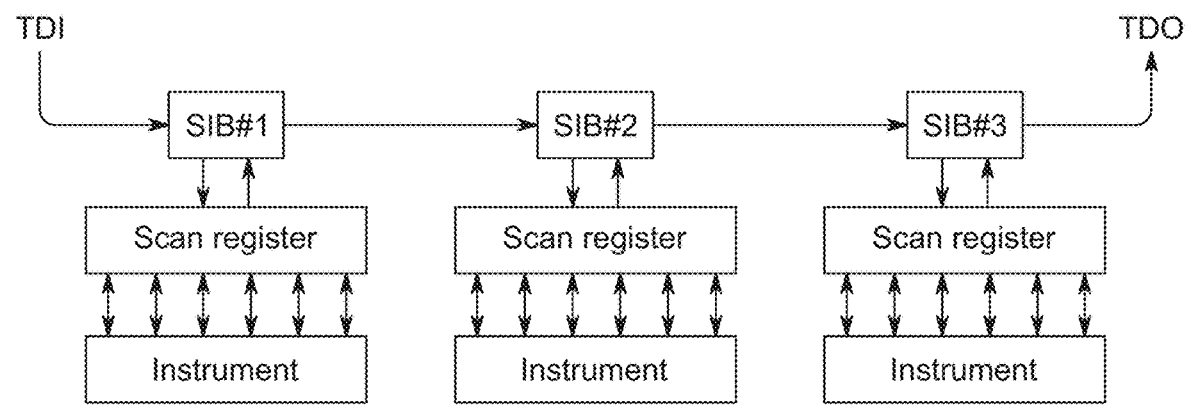
FIG. 4 shows an example of a flat IEEE Std. 1687 network with three instruments.

The IJTAG standard is a methodology for accessing on-chip instrumentations through the reconfigurable scan network. There are different network architectures, such as flat networks, hierarchical networks, multiple networks, and daisy-chained networks. FIG. 4 shows an example of a flat reconfigurable network. Therefore, the presently disclosed system for accessing a plurality of instruments embedded in a semiconductor device may comprises an implementation of an IEEE Std. 1687 for accessing the instruments.

Segment Insertion Bit (SIB)

Figure 5:
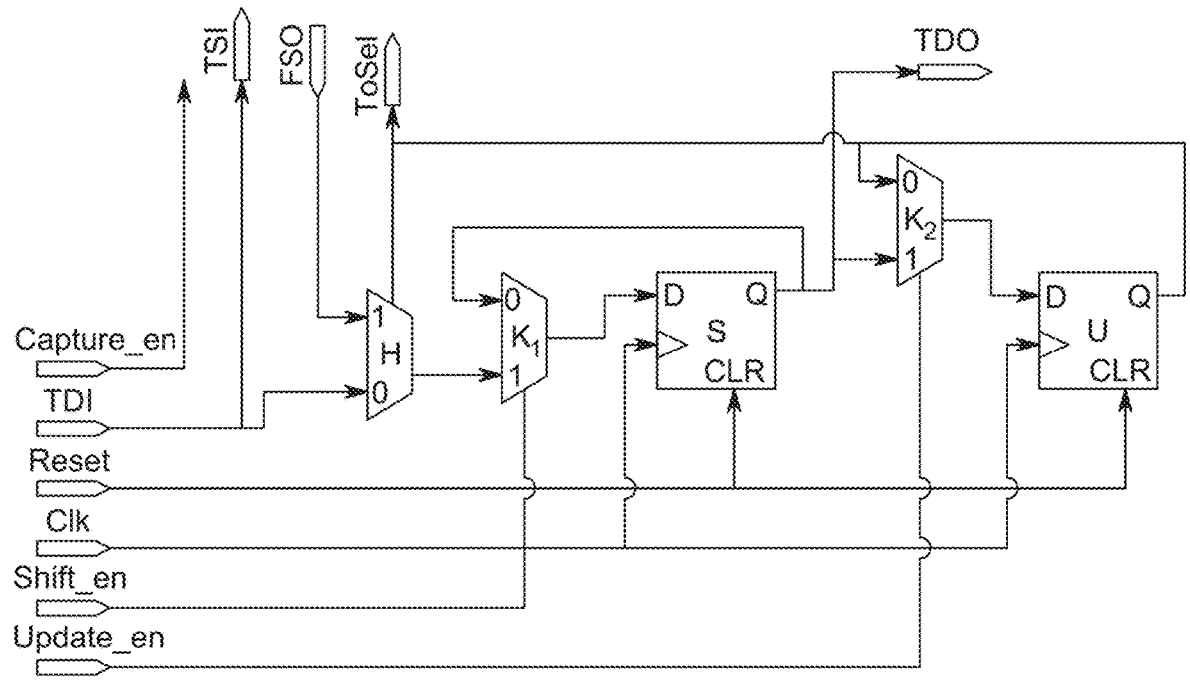
FIG. 5 shows an example of an implementation of a segment insertion bit (SIB)

The system may include a control mechanism for including and excluding instruments in the semiconductor device. A segment insertion bit (SIB) is an example of such a control mechanism, which is used to include or exclude instruments in the reconfigurable network. FIG. 5 shows an example of a schematic of a SIB. In the example there are three control signals (shift en, update en and capture en) to control a SIB. At the beginning, the control bit in the U flip-flop is '0'. Therefore, the MUX H will be connected to the TDI port, and the instruments are excluded from the network. If the SIB unit is in shift mode, the shift en becomes '1' and MUX K1 will be connected to MUX H. Data will be shifted from the TDI into the S flip-flop at the rising edge of the CLK signal. When the SIB unit is not in shift mode, the shift en becomes '0' and the S flip-flop remains its value through the feedback from K1.

If the SIB unit is in update mode, update en becomes '1' and MUX K2 is connected to the S flip-flop. In this way, the U flip-flop gets the values saved in the S flip-flop. When the SIB unit is not in update mode, update en becomes '0' and the U flip-flop keeps its value through the feedback from K2. If the value in the U flip-flop is '0', the instrument will be excluded and MUX H will receive the value directly from TDI. If the value stored in the U flip-flop is '1', the MUX H will be connected to the FSO port and the instrument select signal ToSel will enable the instrument network and the instrument will be included in the scan path.

Figure 6:
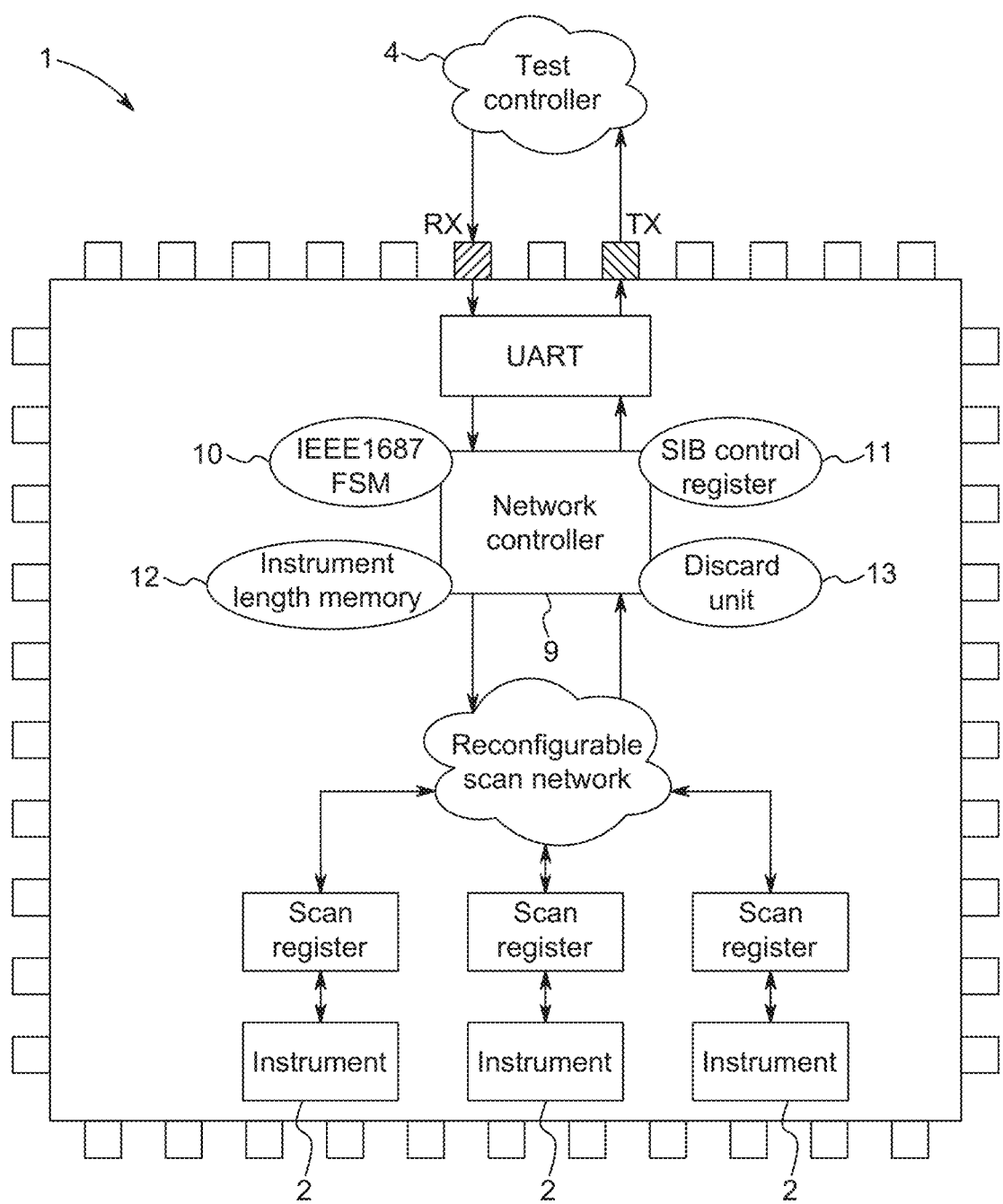
FIG. 6 shows an embodiment of the presently disclosed system for accessing a plurality of instruments embedded in a semiconductor device.

FIG. 6 shows an embodiment of the presently disclosed system (1) for accessing a plurality of instruments (2) embedded in a semiconductor device. The embodiment comprises a UART, a network controller and a reconfigurable scan network. When the test controller (4) is to access the reconfigurable network, the test controller will first send the PDL commands to the UART, which will transfer these commands to a network controller (9). The network controller (9) will control the reconfigurable network according to these commands. The network controller (9) may comprise 4 parts: an IEEE 1687 FSM (10), a SIB control register (SCR) (11), an instrument length memory (12) and a discard unit (13). The IEEE 1687 FSM is for controlling the shift, update and capture signals. The SCR stores information about which instruments are part of the active scan path and what command is to be executed on them. The ILM holds information about the data lengths of the instruments in the network and the position of each instrument. The Discard Unit may allow the controller to discard garbage bits that are outputted by the network during the CSU cycles.

iApply

An iApply command groups a set of commands to specify the way to operate on an instrument such as reading from or writing to the hardware The set of commands may be applied in parallel. Such commands may also be referred to as Level-0 PDL commands. Both the commands are sent by the test controller outside the device under test. The action commands are an iApply command. Setup commands such as iRead or iWrite will be lined up and wait for the action commands.

HW Embodiment

Figure 7:
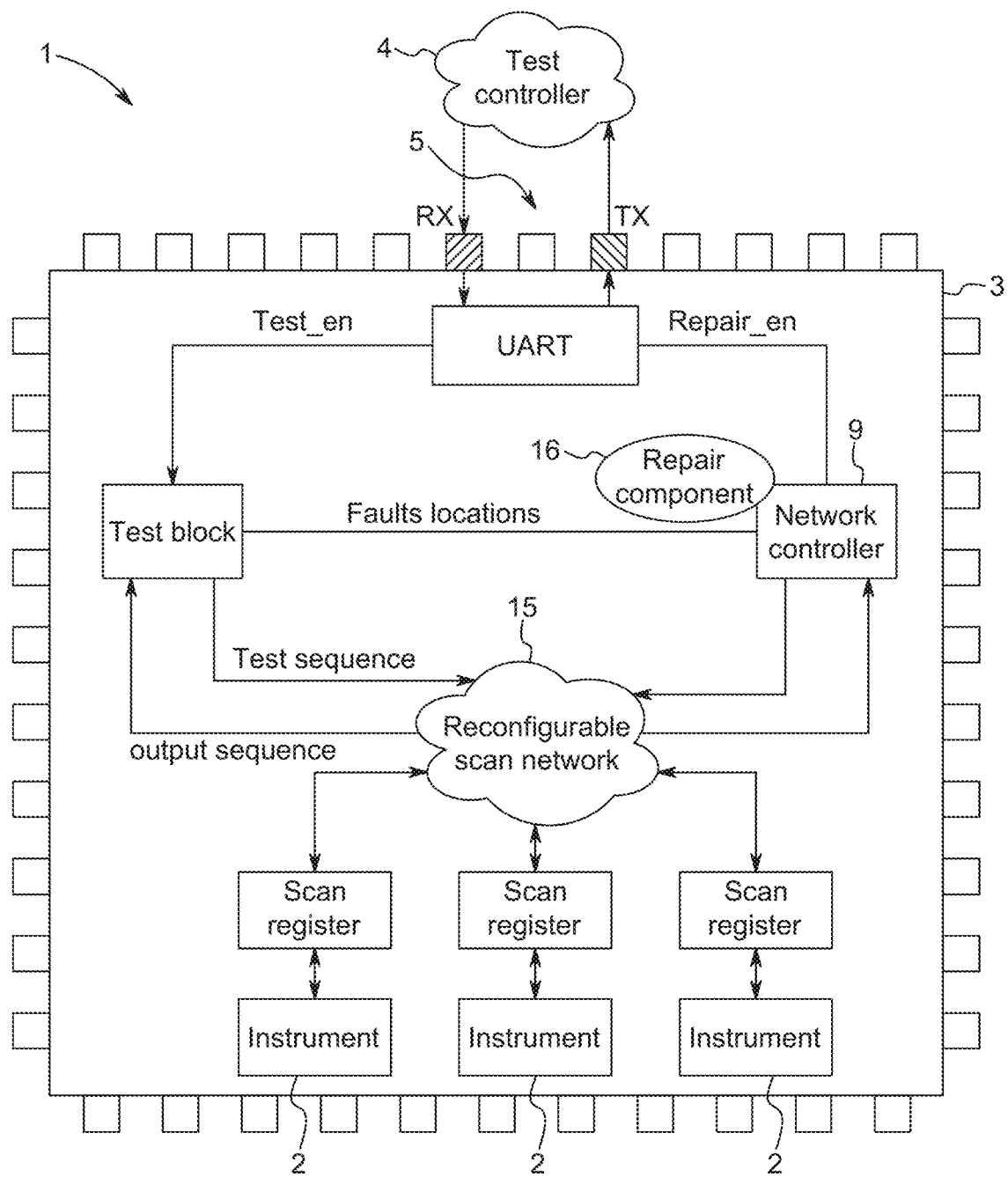
FIG. 7 shows a hardware-implemented embodiment of the presently disclosed system for accessing a plurality of instruments embedded in a semiconductor device.

FIG. 7 shows a hardware-implemented embodiment of the presently disclosed system (1) for accessing a plurality of instruments (2) embedded in a semiconductor device (3). The system (1) comprises a test controller (4) for testing the semiconductor device (3) or generating test patterns for the semiconductor device. The system (1) further comprises a hardware interface (5). The system (1) further comprises a test block (14) embedded in the semiconductor device (3). The testing of the reconfigurable network (15) is initiated by an iTest command being sent from the test controller (4). The iTest command will enable the test block (14). After the testing process ends, the test block (14) will get faulty scan registers locations. When the test controller (4) sends the iRepair command to the UART, the faulty scan registers' locations will be sent to the repair component (16) in the network controller (9). After that, when the test controller (4) wants to access the faulty scan registers in the network, the repair component (16) will check the address with the faulty scan registers' location. If the addresses are the same, the access process will be bypassed. According to one embodiment of the presently disclosed system for accessing a plurality of instruments embedded in a semiconductor device, the test controller is configurable to send a test command to the test block through the hardware interface and/or wherein the test controller is configurable to send a repair command to the test block through the hardware interface.

Figure 9:
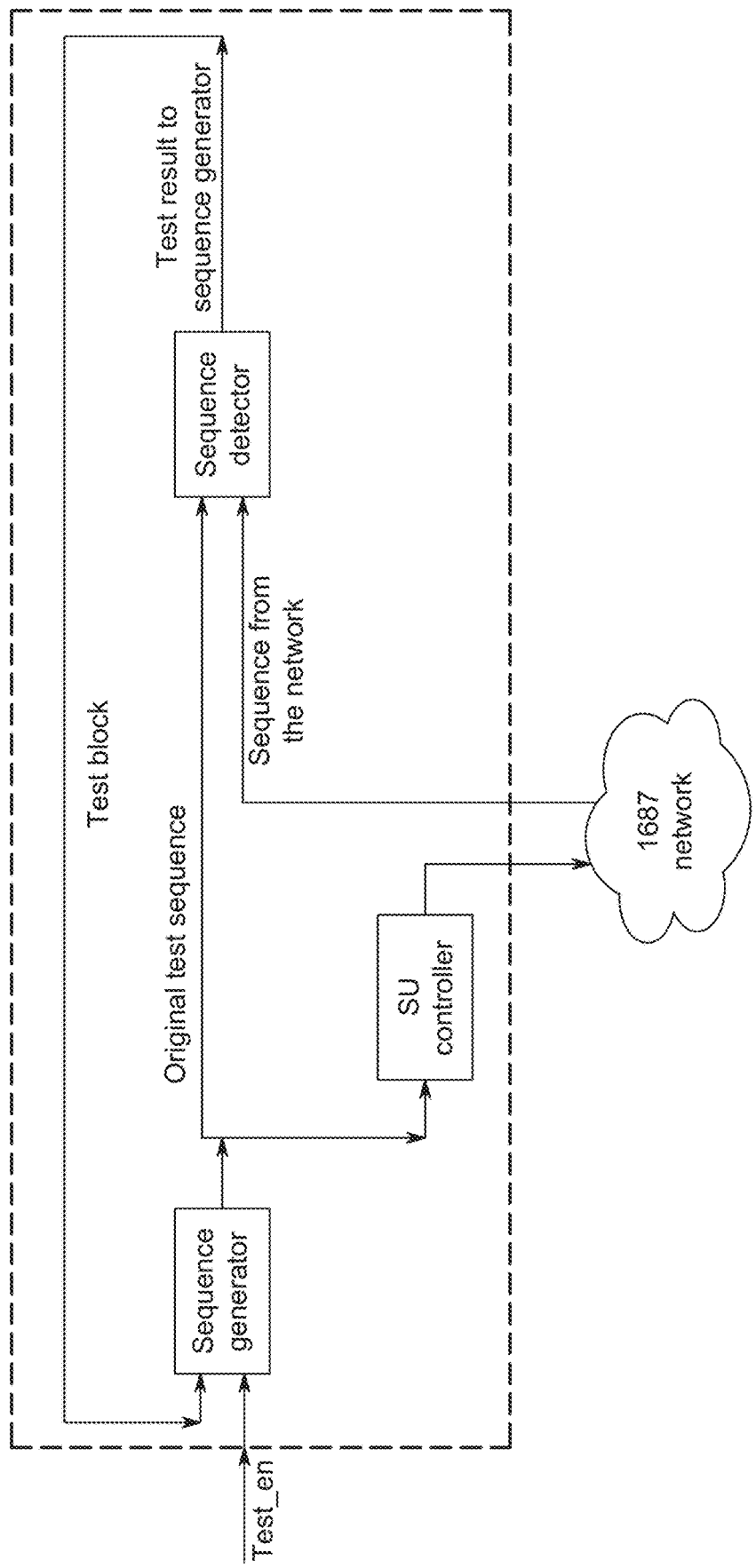
FIG. 9 shows examples of a test block.

FIG. 8 shows examples of bit sequences for test and repair commands. In this example both commands have 16 bits. The first byte '0111 1111' of iTest bit sequence specifies the iTest command and the first byte '0111 1110' of iRepair bit sequence specifies the iRepair command. When the test controller sends the iTest command to the device under test, the test function will be enabled. The overall idea of the test function is to detect and localize faulty scan registers. It may comprise two processes, the FULLTEST and ONEBY-ONE process. First, the FULLTEST process will be executed to test if there are any faults in the scan registers. If there are faults, the ONEBYONE process will be executed to test the scan registers one by one, which will localize the locations of the faults. FIG. 9 shows an example of a test block according to the presently disclosed system for accessing a plurality of instruments embedded in a semiconductor device, which includes the sequence generator, the shift-update (SU) controller and the sequence detector.

Figure 10A:
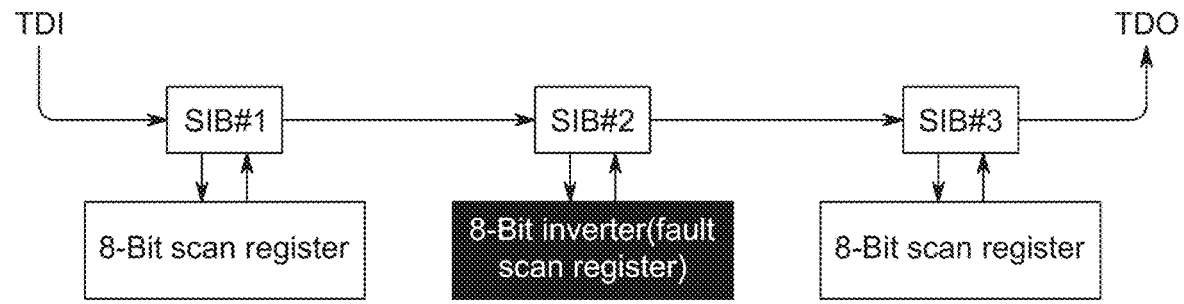
FIG. 10 shows examples of scan paths.
Figure 10B:
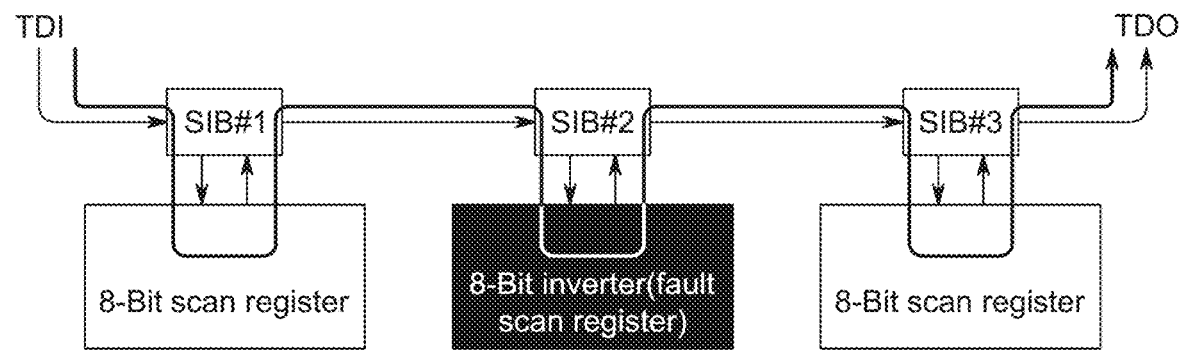

FIG. 10 shows examples of scan paths and an example of use of the presently disclosed system for accessing a plurality of instruments embedded in a semiconductor device. FIG. 10A shows an example of a flat reconfigurable network with 3 SIBs and 3 scan registers where the length of the scan registers is 8 bit. For illustration, we inject a fault in the second scan register, which is controlled by the second SIB. The test function operates as follows:

The sequence generator will generate control bits and test sequence for the FULLTEST process, shown in FIG. 10B. In this example, the control bits should be '111', which will make the network include all the scan registers into the scan path. Then the FULLTEST sequence will be serially shifted into the network. As the scan registers are of length 8 bit, the complete test sequence is '10101010 10101010 10101010'. This sequence is shifted through the scan path. In case of no fault, the shift out sequence is the same as the shift in sequence. However, if there is a fault, for example a stuck at fault, the shift-in sequence and the shift-out sequence will not match.

After the SU controller transfers the control bits and the FULLTEST test sequence to the SIB network, the SU controller will generate the dummy bits '00000000 00000000 00000000' into the SIB network. In this way, the test data can be pushed out from the network.

After the two steps above, the sequence detector will receive the output data from the SIB network and the sequence detector will compare this data with the original test data. In this example, the sequence detector will find that the shift-in sequence and the shift-out sequence do not match. A fault prompt signal will be sent to the sequence generator.

Figure 10C:
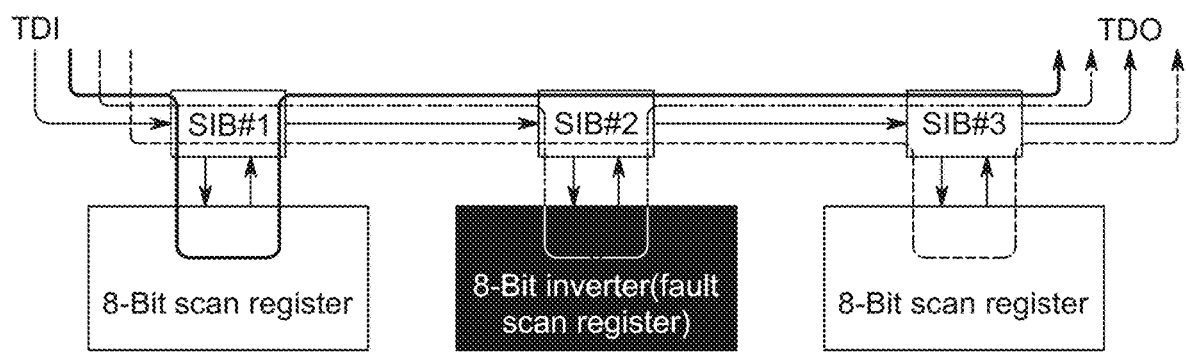

When the sequence generator receives the fault prompt signal, the ONEBY-ONE process will start, which are illustrated in FIG. 10C. The test sequence and the control bits for testing the first scan register will be generated. In this example, the control bit will be '100' to only include the first instrument and the test sequence will be '10101010'. The scan path is shown in red in FIG. 3.7(c).

According to a possible next step, then the SU controller continue generates dummy bits into the network. In this step, the dummy bits should be '00000000'

The sequence detector receives the output data from the network and the original test data. In this example, since the first scan register is not faulty, the fault prompt signal will not be enables.

To include the second scan register in the scan path, the sequence generator generates the control bits "010" and the test sequence '10101010'. The scan path is shown in in FIG. 10C.

When the sequence detector receives both sequences, the mismatch will be detected, and the fault prompt signal will be enabled. The sequence generator saves the location of the faulty scan register into the repair register.

The test block continues to work until all the scan registers have been tested. In this example the information in the repair register should be '010', which indicates that the second scan register is faulty.

Repair Function

The present disclosure introduces a repair function, which may bypass the faulty scan registers. When the iRepair commands are applied, the repair component will be enabled to save the faulty scan registers location from the repair register of sequence generator. After that, when the test controller wants to access faulty scan registers, the repair component will check the faulty scan register locations and automatically exclude them from the scan path.

The test block in the hardware embodiment of the presently disclosed system for accessing a plurality of instruments embedded in a semiconductor device may comprise a repair component configured to exclude specific faulty scan registers from a scan-path.

The system may employ a FAULTScanRegister reg in the form of register array of 8 bits-std logic vector type registers. One example is set out as follows: First, in the IDLE state, reset puts everything in default values. When the repair component starts, the state machine will go to the S0 state. In the S0 state, the component will check the first bit of SCR test in signal, which is the signal that transfers the faulty scan registers location from the repair register of sequence generator. As we discussed in the last subsection, the information in the repair register is '010'. Since the first scan register is not faulty, nothing will be saved in the first register of FAULTScanRegister reg array. After that, in the next rising edge of the clock cycle, the state machine will move to the 51 state. In 51 state, the SCR counter adds 1, which will make the S0 state check the second bit of the repair register. The FAULTScanRegister counter will also add 1, which will transform the second scan register location to binary type (00000001). If there is a faulty scan register location in the next state, the fault location will be saved at the second vector of the FAULTScanRegister reg array. Then the state machine goes to S0 state again, since the second bits of repair register is '1', the faulty scan register location will be saved as "0000 0001" in the second register of FAULTScanRegister reg array. The component will stop until every bits of repair register has been checked. As expected, the component will only save the second scan register location into the FAULTScanRegister reg array.

SW Embodiment

Figure 11:
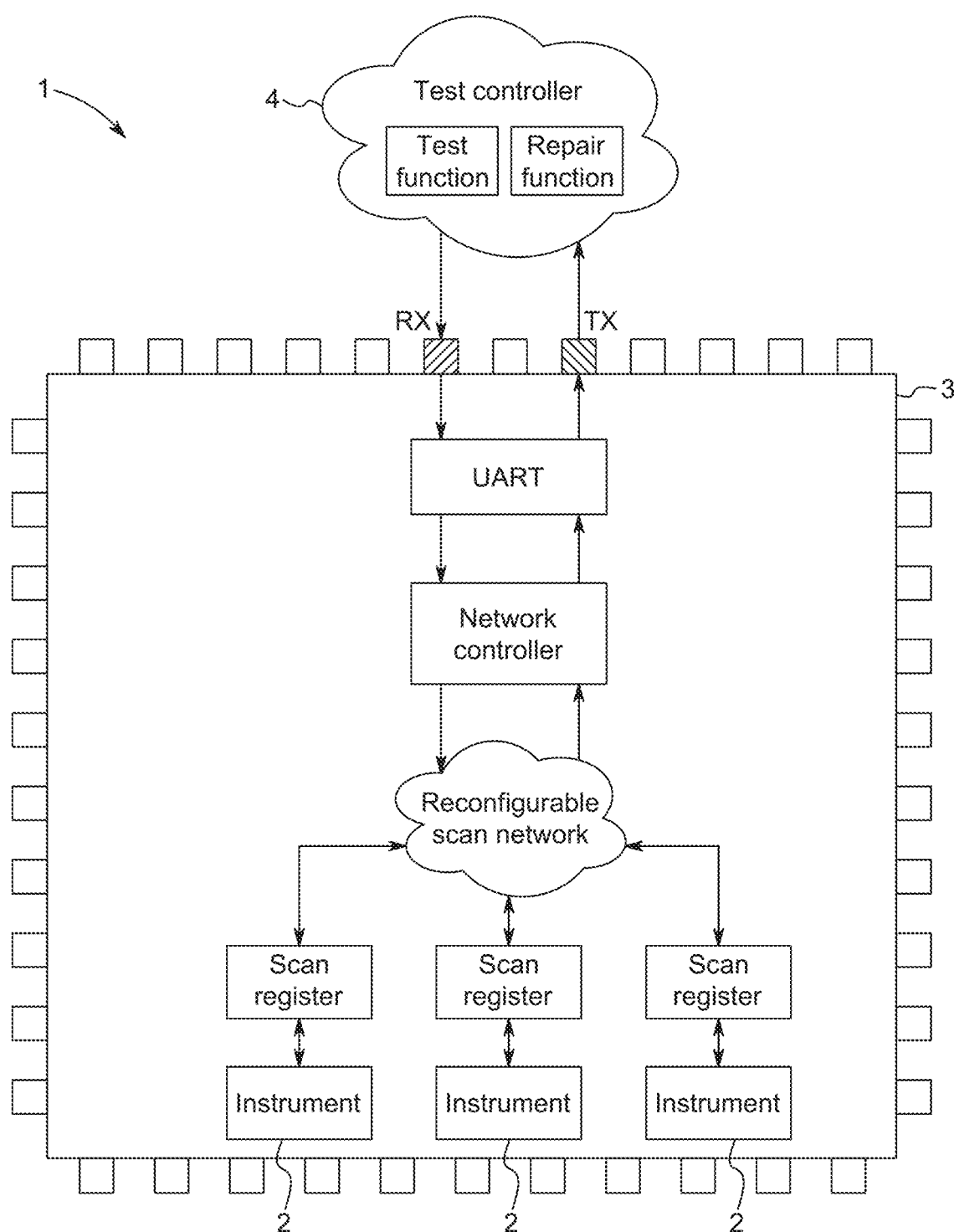
FIG. 11 shows a software-implemented embodiment of the presently disclosed system for accessing a plurality of instruments embedded in a semiconductor device.

FIG. 11 shows a software-implemented embodiment of the presently disclosed system (1) for accessing a plurality of instruments (2) embedded in a semiconductor device (3). In this embodiment the test (14) and repair (16) functions are implemented in the test controller (4). By applying iTest and iRepair commands, the test and repair functions will be enabled. First, the iTest command will be applied to enable the test function. During the test process, the faulty scan registers locations will be detected and saved into a file. After that, the iRepair command will be applied to enable the repair function. During the repair process, when the test controller wants to send the iWrite or iRead commands which related to the faulty scan registers, the iRepair commands will check the faults location file and the iWrite or iRead commands will be bypassed.

Test Function

Figure 12:
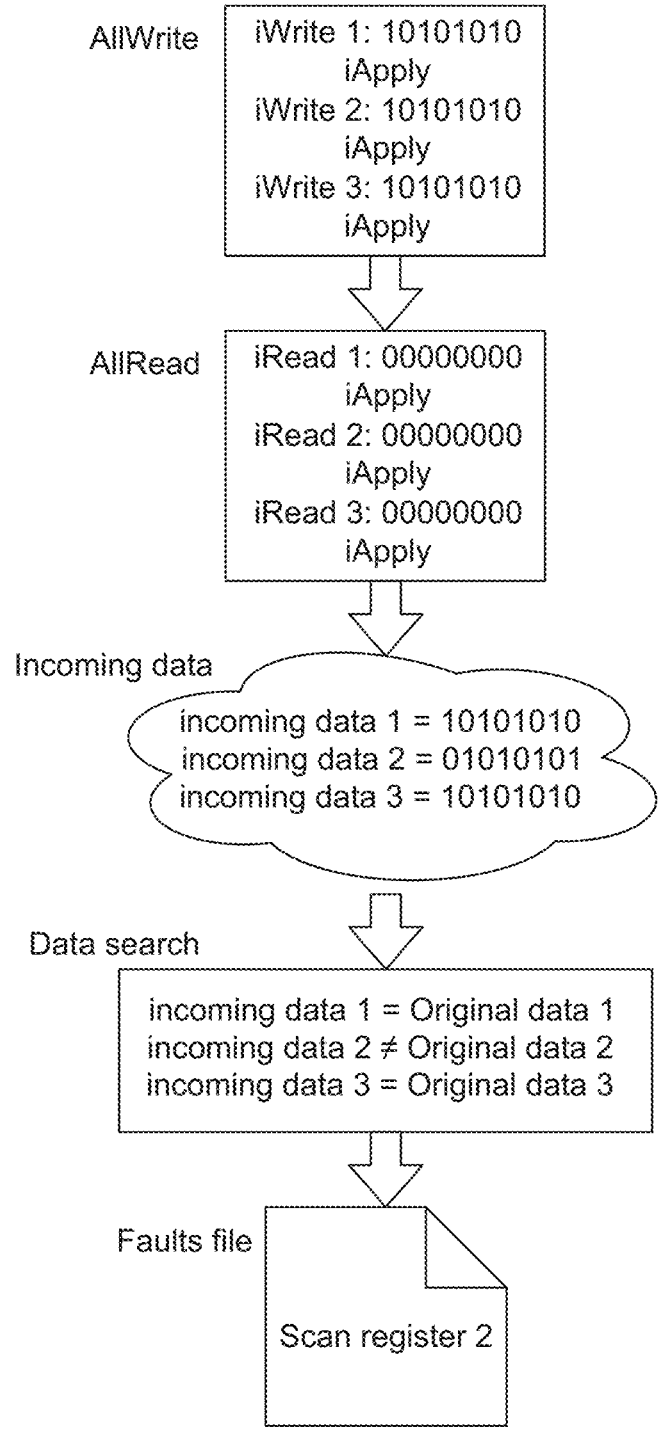
FIG. 12 shows an example of a test process of a software-implemented embodiment.

In one example the same reconfigurable network as in FIG. 10 is used to explain the test process of software solution. FIG. 12 shows an example of a work flow of the test process. The test function first applies the ALLWrite command to write test data '10101010' into all scan registers one by one. FIG. 13 shows the bit sequence of the ALLWrite process.

Then the ALLRead command is be applied to send the dummy bits '00000000' to the scan network so that all the test data can be pushed out from the scan network back to the test controller. In this example, since the second scan register is an inverter which is considered as a fault, the second incoming data should be '01010101'. FIG. 14 shows the bit sequence of the ALLRead process.

Figure 15:
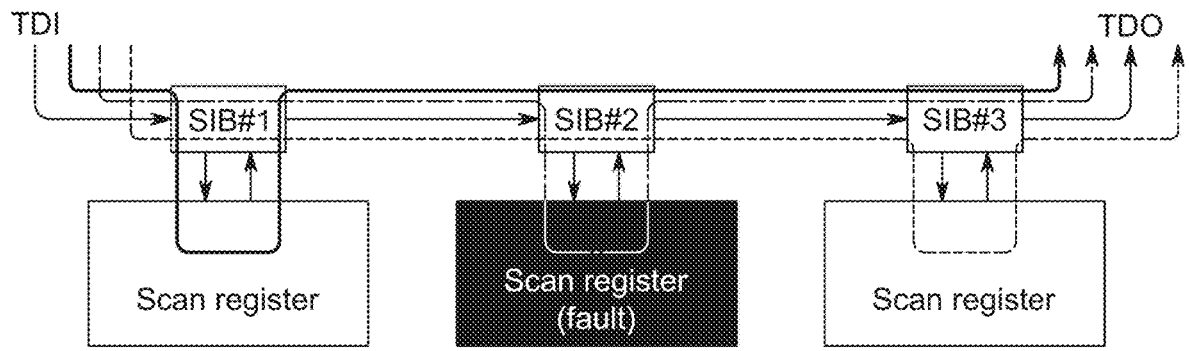
FIG. 15 shows an example of a dataflow of an ALLWrite and ALLRead process.
Figure 16:
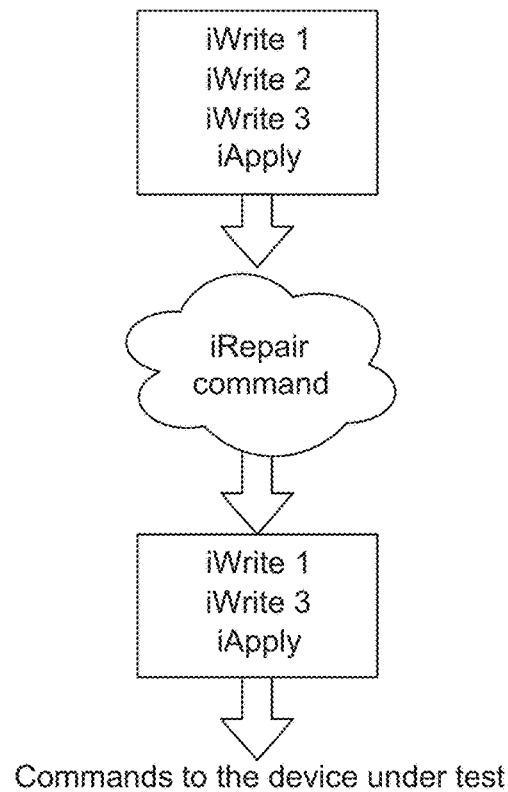
FIG. 16 shows an example of a repair process.

The data flow of ALLWrite and ALLWrite process are shown in FIG. 15.

After that, the iTest function will look for the same data as incoming data in the original data buffer. If there is same data, the corresponding scan register is not faulty. If not, the corresponding scan register has a fault and the address of the scan register will be stored in the FaultScanRegisters file. In this example the second scan register's location will be saved into this file.

Repair Function

The idea of the repair function is to check what PDL commands use. If PDL commands want to access a faulty scan register, the repair function will exclude this PDL command from the iApply group. Hence, the scan path will be modified such that the defective scan register is excluded. For example, in FIG. 15, the commands where the second scan register is bypassed, and the test controller only send the commands which is related to the normal scan registers.

Controlling Access to Instruments

The present disclosure further relates to applying the system and methods for controlling that instruments are only accessed in allowed combinations and detection of access attempts of instruments in non-permitted combinations.

One aspect of the present disclosure relates to a system for controlling access to instruments embedded in a semiconductor device, the system comprising:
- a hardware interface, such as a test access port or a functional port, configured to access a control mechanism for controlling the plurality of instruments;
- a test controller for testing the semiconductor device or generating test patterns for the semiconductor device, wherein the test controller comprises an instrument connectivity language and a procedural description language configuration for operating the instruments,
- a test block is configured to verify that instrument accesses triggered by instructions received through the hardware interface to access the instruments are accessed in an order defined by an access control register.

The test block may be further configured to block accesses that are not allowed. The test block may also be configured to limit the number of bits in, for example, a scan chain that may be accessed.

Figure 17:
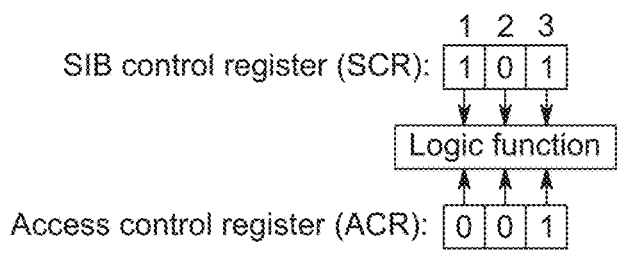
FIG. 17 shows an embodiment of a logic function and an access control register (ACR) that can be used to verify and block access to instruments.

The system for controlling access to instruments embedded in a semiconductor device may be operated according the following example. If, for example, in the system of FIG. 1, instrument i1 should only be accessed is when it is the only instrument in the active scan-path. To enable this, an access control register (ACR) may be used, as shown in the example of FIG. 17. In this example, the PDL will try to access i1 and i3 by setting the SCR so that instruments i1 and i3 are active at the same time. However, as ACR is specified to 001 the logic function will indicate that when instrument i3 is on the active scan-path it must be the only instrument. In this case, the content of the SCR is not accepted by the ACR and the logic function. The result is that access to instruments in this combination can be blocked, a signal can be sent to indicate that an attempt to access instruments in a not allowed combination has been made, and that the involved instruments, the content of SCR, are reported, as the information that instrument i1 was included in the PDL may help in determining if instrument i1 is a Trojan.

Method for Testing a Semiconductor Device and Method for Accessing a Plurality of Instruments Embedded in a Semiconductor Device The present disclosure further relates to a method for testing a semiconductor device and method for accessing a plurality of instruments embedded in a semiconductor device. The methods may be implemented on both the hardware embodiment and the software embodiment. The methods may be implemented as a computer program having instructions, which, when executed by a computing device or computing system, cause the computing device or system to carry out any embodiment of the presently disclosed method of method for testing a semiconductor device and method for accessing a plurality of instruments embedded in a semiconductor device.

According to a first embodiment the method for testing a semiconductor device comprises the steps of:
- configuring a test by defining interconnections of a plurality of instruments in the semiconductor device using an instrument connectivity language and defining operations of the instruments using a procedural description language;
- accessing access segment insertion bits of the plurality of instruments through a hardware interface to test at least one functionality of each of a plurality of instruments, thereby receiving a fault status of each of the plurality of instruments;
- configuring a test block in the semiconductor device to exclude faulty hardware parts for specific instruments based on the fault status of the plurality of instruments, or excluding a procedural description language command specifically related to the faulty hardware parts; and
- performing a full test using all the plurality of instruments in the semiconductor device without updating the defined interconnections and operations of the instruments in the test. The steps do not necessarily have to be sequential.

According to a first embodiment the method for accessing a plurality of instruments embedded in a semiconductor device comprises the steps of:
- providing a hardware interface, such as a test access port or a functional port, configured to access segment insertion bits of the plurality of instruments;
- providing a test controller for testing the semiconductor device or generating test patterns for the semiconductor device, wherein the test controller comprises an instrument connectivity language and a procedural description language configuration for operating the instruments;
- testing at least one functionality of each of the plurality of instruments by accessing the segment insertion bits of the plurality of instruments through the hardware interface, thereby receiving a fault status of each of the plurality of instruments; and
- based on the fault status of the plurality of instruments, configure a test block in the semiconductor device such that valid test patterns for the semiconductor device can be generated without updating the instrument connectivity language and procedural description language configuration.

The steps do not necessarily have to be sequential.

REFERENCES

The following references are hereby incorporated by reference in their entirety:

"IEEE standard for access and control of instrumentation embedded within a semiconductor device," IEEE Std 1687-2014, 2014.

"IEEE standard for access and control of instrumentation embedded within a semiconductor device," IEEE Std. 1149.1, 2013.

Larsson, Erik, Murali, Prathamesh and Kumisbek, Gani, "IEEE Std. P1687.1: translator and protocol", International Test Conference (ITC), 2019

The invention claimed is:

1. A system for accessing a plurality of instruments embedded in a semiconductor device, the system comprising:
- a hardware interface, such as a test access port or a functional port, configured to access a control mechanism for controlling the plurality of instruments;
- a test controller for testing the semiconductor device and generating test patterns for the semiconductor device, wherein the test controller comprises an instrument connectivity language and a procedural description language configuration for operating the instruments, the test controller being configured to perform the steps of:
- testing at least one functionality of each of the plurality of instruments by accessing the control mechanism for controlling the plurality of instruments through the hardware interface, thereby receiving a fault status of each of the plurality of instruments; and
- based on the fault status of the plurality of instruments, configuring a test block in the semiconductor device such that valid test patterns for the semiconductor device can be generated without updating the instrument connectivity language and procedural description language configuration, wherein the instruments are reconfigurable scan networks and the testing is scan testing, wherein the test block comprises a repair component configured to automatically exclude specific faulty scan registers from a scan-path in the scan testing.

2. The system for accessing a plurality of instruments embedded in a semiconductor device according to claim 1, wherein the control mechanism for controlling the plurality of instruments through the hardware interface comprises segment insertion bits for the plurality of instruments.

3. The system for accessing a plurality of instruments embedded in a semiconductor device according to claim 2, wherein the segment insertion bits are configurable to include or exclude the instruments.

4. The system for accessing a plurality of instruments embedded in a semiconductor device according to claim 1, wherein the test block in the semiconductor device is configured to exclude faulty hardware parts for specific instruments based on the fault status.

5. The system for accessing a plurality of instruments embedded in a semiconductor device according to claim 1, wherein the test block in the semiconductor device is configured to replace a faulty hardware part for a specific instrument with a corresponding repair part.

6. The system for accessing a plurality of instruments embedded in a semiconductor device according to claim 1, wherein the step of testing at least one functionality of each of the plurality of instruments comprises generating and shifting a test sequence through scan chains of all instruments.

7. The system for accessing a plurality of instruments embedded in a semiconductor device according to claim 1, wherein the test block is configured to set up an active scan-path such that only instruments without faulty scan chains are included in the testing.

8. The system for accessing a plurality of instruments embedded in a semiconductor device according to claim 1, wherein the test controller is configurable to send a test command to the test block through the hardware interface and/or wherein the test controller is configurable to send a repair command to the test block through the hardware interface.

9. The system for accessing a plurality of instruments embedded in a semiconductor device according to claim 1, wherein the system comprises an implementation of a IEEE Std. 1687 for accessing the instruments.

10. The system for accessing a plurality of instruments embedded in a semiconductor device according to claim 1, wherein the hardware interface is a JTAG interface or a UART interface.

11. A method for testing a semiconductor device, the method comprising:
- configuring a test by defining interconnections of a plurality of instruments in the semiconductor device, wherein the instruments are reconfigurable scan networks, using an instrument connectivity language and defining operations of the instruments using a procedural description language;
- accessing access a control mechanism for controlling the plurality of instruments through a hardware interface to test at least one functionality of each of a plurality of instruments, thereby receiving a fault status of each of the plurality of instruments;
- configuring a test block in the semiconductor device to automatically exclude faulty hardware parts for specific instruments by using a repair component based on the fault status of the plurality of instruments, or excluding a procedural description language command specifically related to the faulty hardware parts; and performing a full test using all the plurality of instruments in the semiconductor device without updating the defined interconnections and operations of the instruments in the test.

12. A method for accessing a plurality of instruments embedded in a semiconductor device, wherein the instruments are reconfigurable scan networks, the method comprising the steps of:

provide a hardware interface, such as a test access port or a functional port, configured to access a control mechanism for controlling the plurality of instruments;

providing a test controller for testing the semiconductor device and generating test patterns for the semiconductor device, wherein the test controller comprises an instrument connectivity language and a procedural description language configuration for operating the instruments;

testing at least one functionality of each of the plurality of instruments by accessing the control mechanism for controlling the plurality of instruments through the hardware interface, thereby receiving a fault status of each of the plurality of instruments; and based on the fault status of the plurality of instruments, configure a test block in the semiconductor device such that valid test patterns for the semiconductor device can be generated without updating the instrument connectivity language and procedural description language configuration by using a repair component to automatically exclude specific faulty scan registers from a scan-path in the scan testing.

* * * * *